(12) United States Patent
Park et al.

(10) Patent No.: US 10,062,511 B1
(45) Date of Patent: Aug. 28, 2018

(54) MULTILAYER ELECTRONIC COMPONENT AND BOARD HAVING THE SAME

(71) Applicant: SAMSUNG ELECTRO-MECHANICS CO., LTD., Suwon-si, Gyeonggi-do (KR)

(72) Inventors: Heung Kil Park, Suwon-si (KR); Se Hun Park, Suwon-si (KR); Gu Won Ji, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/812,198

(22) Filed: Nov. 14, 2017

(30) Foreign Application Priority Data

Jun. 8, 2017 (KR) .................. 10-2017-0071839
Jul. 11, 2017 (KR) .................. 10-2017-0087562

(51) Int. Cl.

| | |
|---|---|
| *H01G 4/232* | (2006.01) |
| *H01G 4/30* | (2006.01) |
| *H01G 4/12* | (2006.01) |
| *H05K 1/11* | (2006.01) |
| *H05K 1/18* | (2006.01) |
| *H01G 4/012* | (2006.01) |
| *H01G 4/248* | (2006.01) |

(52) U.S. Cl.
CPC .......... *H01G 4/232* (2013.01); *H01G 4/1227* (2013.01); *H01G 4/30* (2013.01); *H05K 1/111* (2013.01); *H05K 1/181* (2013.01); *H01G 4/012* (2013.01); *H01G 4/248* (2013.01); *H05K 2201/10015* (2013.01); *H05K 2201/10636* (2013.01); *H05K 2201/10651* (2013.01)

(58) Field of Classification Search
CPC ........ H01G 4/232; H01G 4/1227; H01G 4/30; H05K 1/111; H05K 1/181
USPC ........................................... 174/260
See application file for complete search history.

(56) References Cited

U.S. PATENT DOCUMENTS

| | | | |
|---|---|---|---|
| 8,451,083 B2 * | 5/2013 | Okumura | H01F 5/003 336/200 |
| 2010/0188798 A1 | 7/2010 | Togashi et al. | |
| 2011/0266043 A1 * | 11/2011 | Uesugi | H05K 1/111 174/261 |
| 2014/0016242 A1 * | 1/2014 | Hattori | H01G 2/06 361/303 |

(Continued)

FOREIGN PATENT DOCUMENTS

| | | |
|---|---|---|
| JP | 3847265 B2 | 11/2006 |
| JP | 2012-204572 A | 10/2012 |

(Continued)

*Primary Examiner* — Timothy Thompson
*Assistant Examiner* — Charles Pizzuto
(74) *Attorney, Agent, or Firm* — McDermott Will & Emery LLP

(57) ABSTRACT

A multilayer electronic component includes a capacitor body with first and second external electrodes on a mounting surface of the capacitor body. First and second connection terminals include insulators and are respectively connected to the first and second external electrodes. The first connection terminal includes first to third conductive patterns and a first cut portion a side surface. The second connection terminal includes fourth to sixth conductive patterns and a second cut portion in a side surface.

31 Claims, 7 Drawing Sheets

(56) References Cited

U.S. PATENT DOCUMENTS

2017/0148718 A1* 5/2017 Morita .............. H01L 23/49838

FOREIGN PATENT DOCUMENTS

| KR | 10-2010-0087622 A | 8/2010 |
| KR | 10-2015-0127965 A | 11/2015 |

* cited by examiner

I-I'

MULTILAYER ELECTRONIC COMPONENT AND BOARD HAVING THE SAME

CROSS-REFERENCE TO RELATED APPLICATION(S)

This application claims benefit of priority to Korean Patent Application Nos. 10-2017-0071839 filed on Jun. 8, 2017 and 10-2017-0087562 filed on Jul. 11, 2017 in the Korean Intellectual Property Office, the disclosure of which is incorporated herein by reference in its entirety.

BACKGROUND

1. Field

The present disclosure relates to a multilayer electronic component and a board having the same.

2. Description of Related Art

A multilayer capacitor is a multilayer electronic component and is formed of a dielectric material. The dielectric material may have a piezoelectric property such that it is synchronized and deformed when a voltage is applied.

When the period of the applied voltage is within an audio frequency band, a displacement of the dielectric material becomes vibrations transferred to a circuit board through solders, and the vibrations of the circuit board are thus heard as sound. This sound is known as acoustic noise.

When a device is operated in a silent environment, the user may experience the acoustic noise as extraordinary sound and believe that a fault has occurred in the device. In addition, in a device having an audio circuit, the acoustic noise may overlap the audio output, such that quality of the device may be deteriorated.

In addition, when piezoelectric vibrations of the multilayer capacitor are generated in a high frequency region of 20 kHz or more, separately from the acoustic noise recognized by a user, there may be malfunctions of various sensors used in information technology (IT) and industrial/electrical component fields.

External electrodes of the capacitor and the circuit board are connected to each other by solder. The solder is formed in an inclined state at a predetermined height on surfaces of the external electrodes on opposing side surfaces or opposing end surfaces of the capacitor body.

As the volume and height of the solder are increased, the vibrations of the multilayer capacitor are more easily transferred to the circuit board, which can increase the magnitude of the generated acoustic noise.

SUMMARY

An aspect of the present disclosure may provide a multilayer electronic component capable of reducing acoustic noise in an audio frequency region of 20 kHz or less and high frequency vibrations in a high frequency region of 20 kHz or more, and a board having the same.

According to an aspect of the present disclosure, a multilayer electronic component may include a capacitor body with first and second external electrodes on a mounting surface of the capacitor body and spaced apart from each other. First and second connection terminals include insulators and are respectively connected to the first and second external electrodes. The first connection terminal includes a first conductive pattern on a surface facing the first external electrode, a second conductive pattern on the opposing surface, a first cut portion in a side surface connecting the first and second conductive patterns to each other, and a third conductive pattern on the first cut portion and electrically connecting the first and second conductive patterns to each other. The second connection terminal includes a fourth conductive pattern on a surface facing the second external electrode, a fifth conductive pattern on the opposing surface, a second cut portion in a side surface connecting the fourth and fifth conductive patterns to each other, and a sixth conductive pattern on the second cut portion and electrically connecting the fourth and fifth conductive patterns to each other.

The third conductive pattern may be formed on all the surfaces of the first connection terminal connecting the first and second conductive patterns to each other or on the first cut portion and some of the other surfaces of the first connection terminal. The sixth conductive pattern may be formed on all the surfaces of the second connection terminal connecting the fourth and fifth conductive patterns to each other or on the second cut portion and some of the other surfaces of the second connection terminal.

First and second solder accommodating portions may be provided by the first and second cut portions on the first and second external electrodes, respectively, on the mounting surface of the capacitor body.

The capacitor body may include a plurality of dielectric layers and a plurality of first and second internal electrodes alternately stacked with one or more of the plurality of dielectric layers interposed therebetween. The capacitor body has first and second surfaces opposing each other, third and fourth surfaces connected to the first and second surfaces and opposing each other, and fifth and sixth surfaces connected to the first and second surfaces, connected to the third and fourth surfaces, and opposing each other, and one ends of the first and second internal electrodes may be exposed through the third and fourth surfaces, respectively.

The first and second external electrodes may include, respectively, first and second connection portions respectively on the third and fourth surfaces of the capacitor body and first and second band portions that respectively extend from the first and second connection portions to portions of the first surface of the capacitor body and respectively connected to the first and fourth conductive patterns.

The first and second cut portions may be open toward the third and fourth surfaces of the capacitor body, respectively.

According to another aspect of the present disclosure, a multilayer electronic component may include a capacitor body including a plurality of dielectric layers and a plurality of first and second internal electrodes alternately stacked with one or more of the plurality of dielectric layers interposed therebetween. The capacitor body has first and second surfaces opposing each other, third and fourth surfaces connected to the first and second surfaces and opposing each other, and fifth and sixth surfaces connected to the first and second surfaces, connected to the third and fourth surfaces, and opposing each other. Respective ends of the first and second internal electrodes may be exposed at the third and fourth surfaces, respectively. First and second external electrodes may include, respectively, first and second connection portions respectively on the third and fourth surfaces of the capacitor body and first and second band portions that respectively extend from the first and second connection portions to portions of the first surface of the capacitor body. First and second connection terminals may be connected to the first and second band portions, respectively. The first connection terminal may include a first cut portion open toward the third surface of the capacitor body, with portions constituting opposing surfaces of the first connection terminal in the direction connecting the first and second surfaces of the capacitor body to each other and the first cut portion of the first connection terminal having conductivity, and circumferential surfaces of the first connection terminal other than the first cut portion have insulating properties. The second connection terminal may include a second cut portion open toward the fourth surface of the capacitor body, with portions constituting opposing surfaces of the second connection terminal in the direction connecting the first and second surfaces of the capacitor body to each other and the second cut portion of the second connection terminal having conductivity, and circumferential surfaces of the second connection terminal other than the second cut portion have insulating properties.

First and second solder accommodating portions may be provided by the first and second cut portions on the first and second band portions, respectively, on a mounting surface of the capacitor body.

The first and second cut portions may have curved surfaces.

The first and second cut portions may have a 'c' shape.

The first and second connection terminals may be bump terminals.

The first and second connection terminals may be insulating substrates.

The first and second connection terminals may be circuit boards.

Insulators included in the first and second connection terminals may include epoxy.

First to sixth conductive patterns may be metal patterns.

According to another aspect of the present disclosure, a board having a multilayer electronic component may include a circuit board having first and second electrode pads on one surface thereof. The multilayer electronic component as described above may be mounted on the circuit board so that the first and second connection terminals are connected to the first and second electrode pads, respectively.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will be described in detail with reference to the accompanying drawings.

Figure 1:
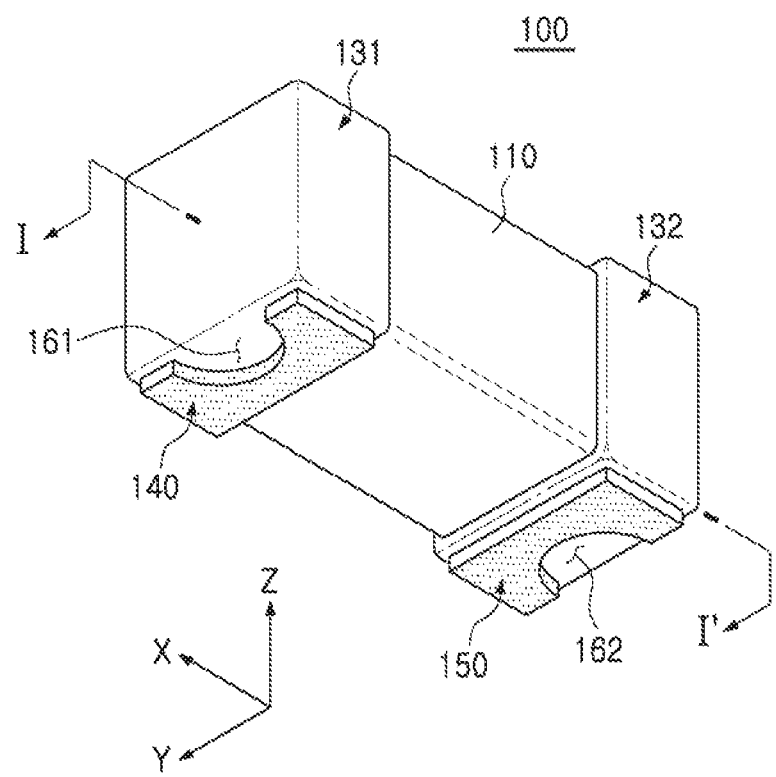
FIG. 1 is a perspective view illustrating a multilayer electronic component according to a first exemplary embodiment in the present disclosure.
Figure 2:
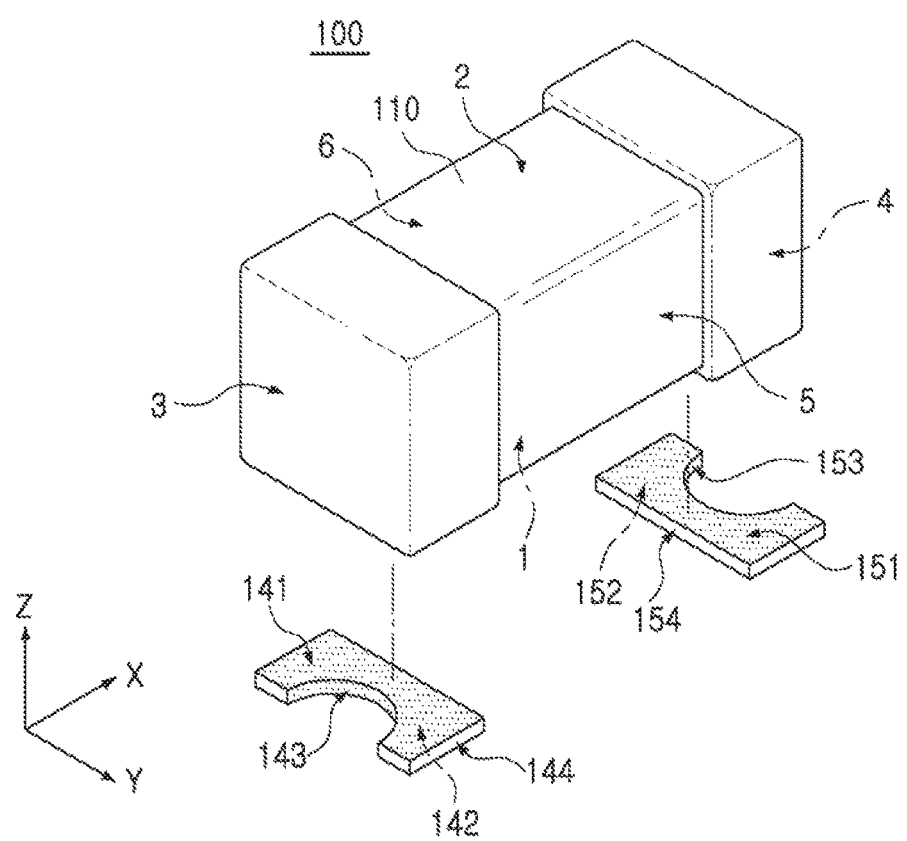
FIG. 2 is an exploded perspective view of the first exemplary embodiment of FIG. 1, separately illustrating first and second connection terminals.
Figure 3A:
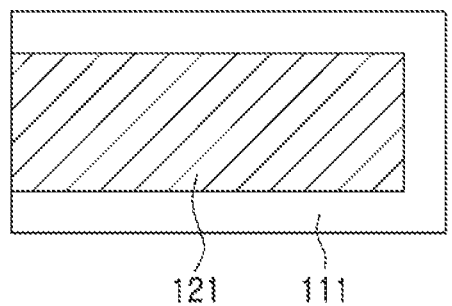
FIGS. 3A and 3B are plan views illustrating, respectively, first and second internal electrodes of the multilayer electronic component according to the first exemplary embodiment in the present disclosure.
Figure 3B:
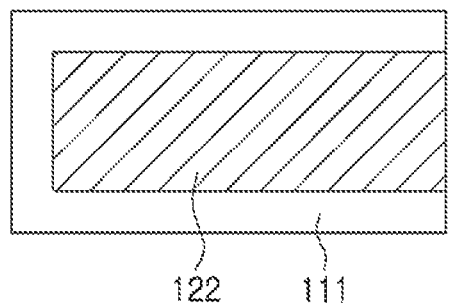
Figure 4:
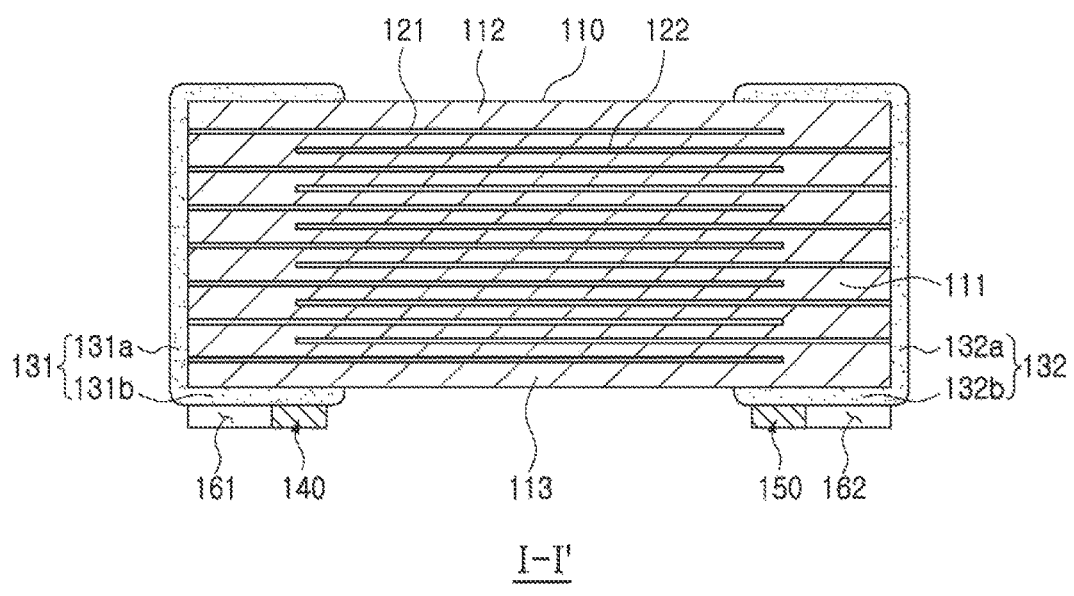
FIG. 4 is a cross-sectional view taken along line I-I' of FIG. 1.
Figure 5A:
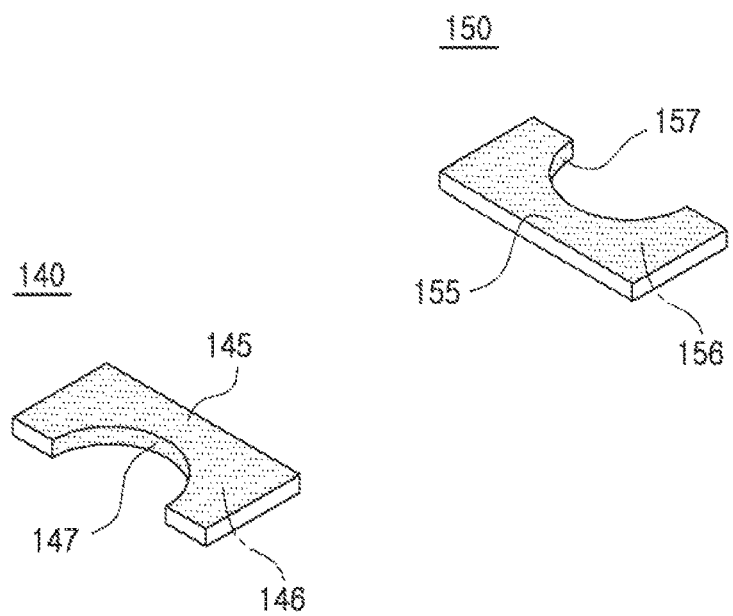
FIG. 5A is a perspective view illustrating the first and second connection terminals of FIG. 1.

FIG. 1 is a perspective view illustrating a multilayer electronic component according to a first exemplary embodiment in the present disclosure. FIG. 2 is an exploded perspective view separately illustrating the first and second connection terminals. FIGS. 3A and 3B are plan views illustrating, respectively, the first and second internal electrodes. FIG. 4 is a cross-sectional view taken along line I-I' of FIG. 1. FIG. 5A is a perspective view illustrating the first and second connection terminals.

Referring to FIGS. 1 through 5A, a multilayer electronic component 100 according to a first exemplary embodiment in the present disclosure may include a capacitor body 110, first and second external electrodes 131 and 132 on a mounting surface of the capacitor body 110 and spaced apart from each other, and first and second connection terminals 140 and 150 that include insulators and are connected to the first and second external electrodes 131 and 132, respectively.

Hereinafter, the directions of the capacitor body 110 will be defined in order to clearly describe exemplary embodiments in the present disclosure. X, Y and Z in the drawings refer to a length direction, a width direction, and a thickness direction of the capacitor body 110, respectively. In the present exemplary embodiment, the thickness direction refers to a stacked direction in which dielectric layers are stacked.

The capacitor body 110 may be formed by stacking and then sintering a plurality of dielectric layers 111 in the Z direction. The capacitor body 110 may include the plurality of dielectric layers 111 and a plurality of first and second internal electrodes 121 and 122 alternately stacked in the Z direction with the dielectric layers 111 interposed therebetween.

Covers 112 and 113 having a predetermined thickness may be formed, respectively, on both sides of the capacitor body 110 in the Z direction, if necessary.

The respective adjacent dielectric layers 111 of the capacitor body 110 may be integrated with each other so that boundaries therebetween are not readily apparent.

The capacitor body 110 may have a substantially hexahedral shape, but the shape of the capacitor body 110 is not limited thereto.

In the present exemplary embodiment, for convenience of explanation, first and second surfaces 1 and 2 of the capacitor body 110 refer to respective surfaces of the capacitor body 110 opposing each other in the Z direction, third and fourth surfaces 3 and 4 of the capacitor body 110 refer to respective surfaces of the capacitor body 110 connected to the first and second surfaces 1 and 2 and opposing each other in the X direction, and fifth and sixth surfaces 5 and 6 of the capacitor body 110 refer to respective surfaces of the capacitor body 110 connected to the first and second surfaces 1 and 2, connected to the third and fourth surfaces 3 and 4, and opposing each other in the Y direction. In the present exemplary embodiment, the first surface 1 may be a mounting surface.

The dielectric layer 111 may include a ceramic material having a high dielectric constant, for example, a barium titanate ($BaTiO_3$) based ceramic powder, or the like. However, the material of the dielectric layer 111 is not limited thereto.

The barium titanate ($BaTiO_3$) based ceramic powder may include, for example, $(Ba_{1-x}Ca_x)TiO_3$, $Ba(Ti_{1-y}Ca_y)O_3$, $(Ba_{1-x}Ca_x)(Ti_{1-y}Zr_y)O_3$, $Ba(Ti_{1-y}Zr_y)O_3$, or the like, in which Ca, Zr, or the like, is partially dissolved in $BaTiO_3$. However, the barium titanate ($BaTiO_3$) based ceramic powder is not limited thereto.

The dielectric layer 111 may further include a ceramic additive, an organic solvent, a plasticizer, a binder, a dispersant, and the like, in addition to the ceramic powder. The ceramic additive may be, for example, a transition metal oxide or a transition metal carbide, a rare earth element, magnesium (Mg), aluminum (Al), or the like.

The first and second internal electrodes 121 and 122 are electrodes having different polarities and may be alternately stacked to face each other in the Z direction with dielectric layers 111 interposed therebetween. Respective ends of the first and second internal electrodes 121 and 122 may be exposed at the third and fourth surfaces 3 and 4 of the capacitor body 110, respectively.

The first and second internal electrodes 121 and 122 may be electrically insulated from each other by the dielectric layer 111 disposed therebetween.

The respective end portions of the first and second internal electrodes 121 and 122 alternately exposed at the third and fourth surfaces 3 and 4 of the capacitor body 110, respectively, may be electrically connected to first and second external electrodes 131 and 132 disposed on third and fourth surfaces 3 and 4 of a capacitor body 110 as described below, respectively.

The first and second internal electrodes 121 and 122 may be formed of a conductive metal, for example, a material such as nickel (Ni), a nickel (Ni) alloy, or the like. However, materials of the first and second internal electrodes 121 and 122 are not limited thereto.

According to the configuration as described above, when predetermined voltages are applied to the first and second external electrodes 131 and 132, electric charges may accumulate between the first and second internal electrodes 121 and 122 facing each other.

The capacitance of the multilayer ceramic component 100 may be proportional to the area by which the first and second internal electrodes 121 and 122 overlap each other in the Z direction.

Voltages having different polarities may be applied to the first and second external electrodes 131 and 132, respectively, and the first and second external electrodes 131 and 132 may be electrically connected to the exposed portions of the first and second internal electrodes 121 and 122, respectively.

Plating layers may be formed on surfaces of the first and second external electrodes 131 and 132, if necessary.

For example, the first and second external electrodes 131 and 132 may include first and second conductive layers, first and second nickel (Ni) plating layers formed on the first and second conductive layers, and first and second tin (Sn) plating layers formed on the first and second nickel plating layers, respectively.

The first external electrode 131 may include a first connection portion 131a and a first band portion 131b.

The first connection portion 131a may be formed on the third surface 3 of the capacitor body 110 and be connected to the first internal electrodes 121. The first band portion 131b may extend from the first connection portion 131a to a portion of the first surface 1 of the capacitor body 110, which is the mounting surface of the capacitor body 110, and be connected to the first connection terminal 140.

The first band portion 131b may also extend to a portion of the second surface 2 of the capacitor body 110 and portions of the fifth and sixth surfaces 5 and 6 of the capacitor body 110, if necessary, in order to improve adhesion strength, or the like.

The second external electrode 132 may include a second connection portion 132a and a second band portion 132b.

The second connection portion 132a may be formed on the fourth surface 4 of the capacitor body 110 and be connected to the second internal electrodes 122. The second band portion 132b may extend from the second connection portion 132a to a portion of the first surface 1 of the capacitor body 110, which is the mounting surface of the capacitor body 110, and be connected to the second connection terminal 150.

The second band portion 132b may also extend to a portion of the second surface 2 of the capacitor body 110 and portions of the fifth and sixth surfaces 5 and 6 of the capacitor body 110, if necessary, in order to improve adhesion strength, or the like.

The first connection terminal 140 may include an insulator, and may also include first and second conductive patterns 145 and 146 formed of a conductive metal. The first connection terminal 140 may be, for example, an insulating substrate or a circuit board such as FR4, but is not limited thereto. The first connection terminal 140 may be a bump terminal.

The first conductive pattern 145 may be formed on a surface 141 of the first connection terminal 140 facing the first band portion 131b of the first external electrode 131, and the second conductive pattern 146 may be formed on an opposing surface 142 of the first connection terminal 140, opposing the surface 141 of the first connection terminal 140 on which the first conductive pattern 145 is formed.

The first and second conductive patterns 145 and 146 of the first connection terminal 140 may have the same polarity to thus act as one and the other of a signal terminal and a ground terminal, respectively.

A first cut portion 143 may be formed in some of circumferential surfaces of the first connection terminal 140 between the two surfaces 141 and 142 on which the first and second conductive patterns 145 and 146 are formed, respectively. A first solder accommodating portion 161 may thus be provided as a solder pocket on the first band portion 131b on the first surface 1 of the capacitor body 110, which is the mounting surface of the capacitor body 110.

In the present exemplary embodiment, the first cut portion 143 may be open toward the third surface 3 of the capacitor body 110. The first cut portion 143 may have a curved surface.

A third conductive pattern 147 formed of a conductive metal and electrically connecting the first and second conductive patterns 145 and 146 to each other may be formed on the first cut portion 143. The third conductive pattern 147 may be formed by plating. As described above, the first to third conductive patterns 145, 146, and 147 may be metal patterns.

Through the configuration described above, portions constituting both surfaces 141 and 142 of the first connection terminal 140 in a direction connecting the first and second surfaces 1 and 2 of the capacitor body 110 to each other and the first cut portion 143 of the first connection terminal 140 may have conductivity, and circumferential surfaces 144 of the first connection terminal 140 except for the first cut portion 143 may have insulating properties.

The second connection terminal 150 may include an insulator, and may also include fourth and fifth conductive patterns 155 and 156 formed of a conductive metal. The second connection terminal 150 may be, for example, an insulating substrate or a circuit board such as FR4, but is not limited thereto. The second connection terminal 150 may be a bump terminal.

The fourth conductive pattern 155 may be formed on a surface 151 of the second connection terminal 150 facing the second band portion 132b of the second external electrode 132, and the fifth conductive pattern 156 may be formed on an opposing surface 152 of the second connection terminal 150, opposing the surface 151 of the second connection terminal 150 on which the fourth conductive pattern 155 is formed.

The fourth and fifth conductive patterns 155 and 156 of the second connection terminal 150 may have the same polarity to thus act as a terminal having the same polarity, of a signal terminal and a ground terminal.

A second cut portion 153 may be formed in some of circumferential surfaces of the second connection terminal 150 between the two surfaces 151 and 152 on which the fourth and fifth conductive patterns 155 and 156 are formed, respectively. A second solder accommodating portion 162 may thus be provided as a solder pocket on the second band portion 132b on the first surface 1 of the capacitor body 110, which is the mounting surface of the capacitor body 110.

In the present exemplary embodiment, the second cut portion 153 may be open toward the fourth surface 4 of the capacitor body 110. The second cut portion 153 may have a curved surface.

A sixth conductive pattern 157 formed of a conductive metal and electrically connecting the fourth and fifth conductive patterns 155 and 156 to each other may be formed on the second cut portion 153. The sixth conductive pattern 157 may be formed by plating.

Through the configuration described above, portions constituting both surfaces 151 and 152 of the second connection terminal 150 in the direction connecting the first and second surfaces 1 and 2 of the capacitor body 110 to each other and the second cut portion 153 of the second connection terminal 150 may have conductivity, and circumferential surfaces 154 of the second connection terminal 150 except for the second cut portion 153 may have insulating properties. As described above, the fourth to sixth conductive patterns 155, 156, and 157 may be metal patterns.

Figure 5B:
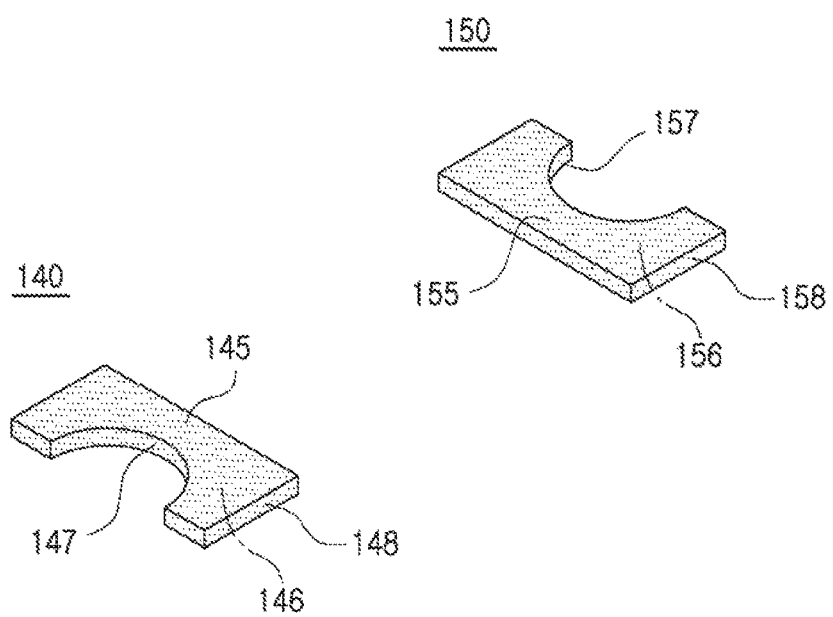
FIG. 5B is a perspective view illustrating another example of third and sixth conductive patterns in FIG. 5A.

Referring to FIG. 5B, a third conductive pattern including patterns 147 and 148 may be formed on all the surfaces 143 and 144 of the first connection terminal 140 that connect the first and second conductive patterns 145 and 146 to each other, or on the first cut portion 143 and some of the other surfaces. A sixth conductive pattern including patterns 157 and 158 may be formed on all the surfaces 153 and 154 of the second connection terminal 150 that connect the fourth and fifth conductive patterns 155 and 156 to each other, or on the second cut portion 153 and some of the other surfaces.

When the third conductive pattern and the sixth conductive pattern are additionally formed on all or some of the circumferential surfaces of the first and second connection terminals 140 and 150, respectively, as described above, soldering is may performed not only on inner portions of the first and second cut portions 143 and 153, but may also be performed on the circumferential surfaces as well as the first and second cut portions 143 and 153 to improve a misalignment level in the position between the multilayer electronic component and the circuit board when mounting the multilayer electronic component on the circuit board. The third and sixth conductive patterns may be formed by plating.

The first and second connection terminals 140 and 150 may allow the capacitor body 110 to be spaced apart from the circuit board by a predetermined distance to thus suppress piezoelectric vibrations generated from the capacitor body 110 from being introduced into the circuit board. Such an effect may be improved when the thicknesses of the first and second connection terminals 140 and 150 are a predetermined thickness or more. The thicknesses of the first and second connection terminals 140 and 150 may be, for example, 60 μm or more, but are not limited thereto.

The first and second connection terminals 140 and 150 may include plating layers, if necessary. The plating layers may include nickel (Ni) plating layers formed on the first to sixth conductive patterns of the first and second connection terminals 140 and 150 and tin (Sn) plating layers formed on the nickel plating layers.

Figure 6:
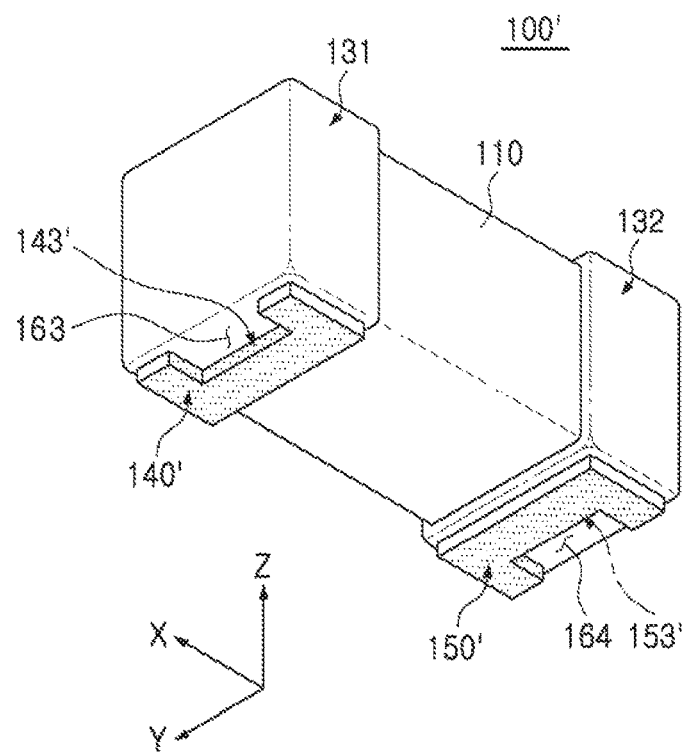
FIG. 6 is a perspective view illustrating a multilayer electronic component according to a second exemplary embodiment in the present disclosure.

FIG. 6 illustrates a multilayer electronic component 100' according to another exemplary embodiment in the present disclosure, with first and second cut portions 143' and 153' of first and second connection terminals 140' and 150' having a 'c' shape.

The first and second cut portions 143' and 153' may be open toward the third and fourth surfaces of the capacitor body 110 in the X direction, respectively.

First and second solder accommodating portions 163 and 164 having a quadrangular shape may be provided on the first and second band portions of the first and second external electrodes 131 and 132, respectively, on the first surface of the capacitor body 110.

Therefore, a relatively greater volume of solder pockets may be secured as compared to a multilayer electronic component where the cut portions are formed in a curved surface shape, and a relatively greater volume of solder may thus be trapped when the multilayer electronic component 100' is mounted on the circuit board. Resultantly, the formation of solder fillets may be effectively suppressed to further improve the acoustic noise reducing effect of the multilayer electronic component 100'.

In the present disclosure, the first and second cut portions, which include a plurality of bent surfaces, may include two surfaces having one bent portion or include four or more surfaces having three or more bent portions, in addition to the 'c' shape illustrated in FIG. 6.

Figure 7:
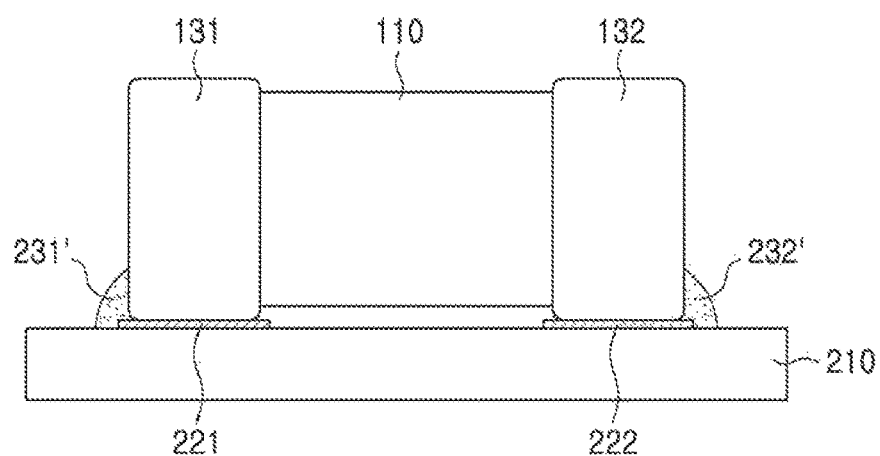
FIG. 7 is a schematic front view illustrating the multilayer capacitor mounted on a circuit board without connection terminals.
Figure 8:
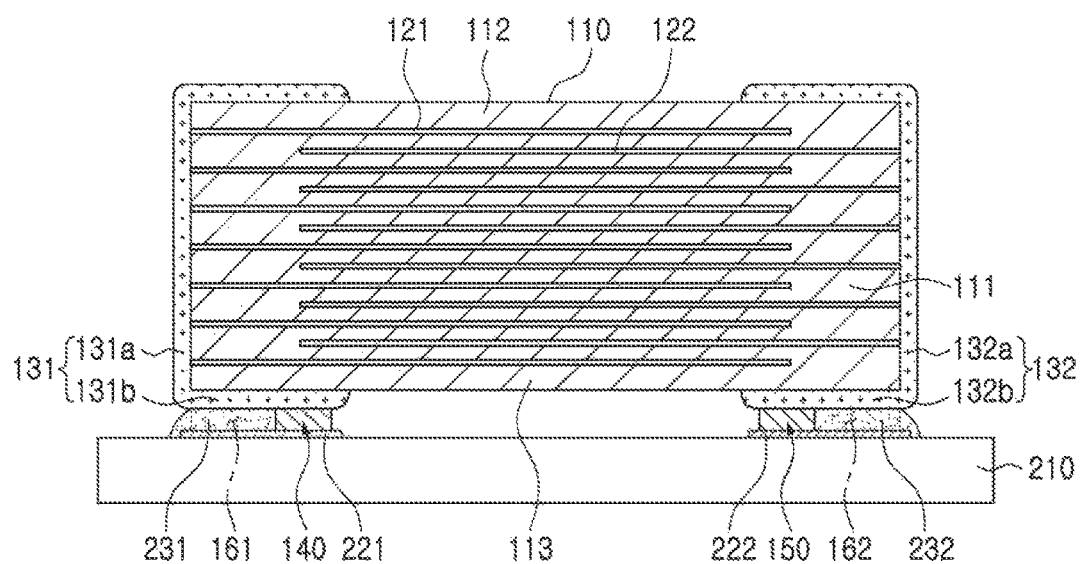
FIG. 8 is a cross-sectional view illustrating the multilayer electronic component according to the first exemplary embodiment in the present disclosure mounted on a circuit board.

FIG. 7 is a schematic front view illustrating the multilayer capacitor mounted on a circuit board without connection terminals. FIG. 8 is a cross-sectional view illustrating the multilayer electronic component according to the first exemplary embodiment in the present disclosure mounted on a circuit board.

When voltages having different polarities are applied to the first and second external electrodes 131 and 132 on the multilayer electronic component 100 when the multilayer electronic component 100 is mounted on a circuit board 210, the capacitor body 110 may expand and contract in the thickness direction due to an inverse piezoelectric effect of the dielectric layers 111. Both end portions of the first and second external electrodes 131 and 132 may contract and expand as opposed to the expansion and the contraction of the capacitor body 110 in the thickness direction due to the Poisson effect.

This contraction and expansion may generate vibrations. The vibrations may be transferred from the first and second external electrodes 131 and 132 to the circuit board 210, and sound may thus be radiated from the circuit board 210, which becomes the acoustic noise.

Referring to FIG. 7, solder 231' and 232' is formed, respectively, between first and second external electrodes 131 and 132 of the multilayer capacitor and first and second electrode pads 221 and 222 on one surface of the circuit board 210. Solder 231' and 232' is formed at a predetermined height toward a second surface of a capacitor body 110, such that a large amount of the vibrations generated from the multilayer capacitor may be transferred to the circuit board.

Referring to FIG. 8, a circuit board 210 may have first and second electrode pads 211 and 222 on one surface and the multilayer electronic component 100 may be mounted on an upper surface of the circuit board 210 so that the first and second connection terminals 140 and 150 are connected to the first and second electrode pads 221 and 222, respectively.

In the present exemplary embodiment, the multilayer electronic component 100 is illustrated and described as being mounted on the circuit board 210 by solder 231 and 232, but conductive paste may be used instead of solder.

According to the present exemplary embodiment, the piezoelectric vibrations transferred to the first and second external electrodes 131 and 132 of the multilayer electronic component 100 to the circuit board may be absorbed through elasticity of the first and second connection terminals 140 and 150, including insulators formed of a soft material, and acoustic noise may thus be reduced.

The first and second solder accommodating portions provided by the first and second cut portions of the first and second connection terminals 140 and 150, respectively, may serve as solder pockets that can trap the solder 231 and 232 on the first surface of the capacitor body 110.

In the present exemplary embodiment, circumferential surfaces other than the first and second cut portions among the circumferential surfaces of the first and second connection terminals 140 and 150 may be insulating surfaces.

Therefore, the solder is not formed on the circumferential surfaces of the first and second connection terminals except for the first and second cut portions when the multilayer electronic component 100 is mounted on the circuit board 210. The solder 231 and 232 may thus be more effectively held in the first and second solder accommodating portions 161 and 162, respectively. Therefore, formation of solder fillets toward the second surface of the capacitor body 110 may be suppressed.

The piezoelectric vibration transfer path of the multilayer electronic component 100 may thus be blocked, and the solder fillets and a maximum displacement point in the capacitor body 110 may be spaced apart from each other to significantly improve the acoustic noise reducing effect of the multilayer electronic component 100 as compared to a structure of FIG. 7.

According to the present exemplary embodiment, the amount of piezoelectric vibrations of the multilayer electronic component transferred to the circuit board at an audio frequency within 20 kHz of the multilayer electronic component may be effectively suppressed by the acoustic noise reducing structure described above.

Therefore, high frequency vibrations of the multilayer electronic component may be reduced to prevent malfunctions of sensors that may be caused by high frequency vibrations of 20 kHz or more of the multilayer electronic component in information technology (IT) or industry/electrical component fields and suppress accumulation of internal fatigue of the sensors due to vibrations for a long period of time.

As set forth above, according to the exemplary embodiments in the present disclosure, acoustic noise in an audio frequency region of 20 kHz or less and the high frequency vibrations in the high frequency region of 20 kHz or more of the multilayer electronic component may be reduced.

While exemplary embodiments have been shown and described above, it will be apparent to those skilled in the art that modifications and variations could be made without departing from the scope of the present invention as defined by the appended claims.

What is claimed is:

1. A multilayer electronic component comprising:
    a capacitor body;
    first and second external electrodes on a mounting surface of the capacitor body and spaced apart from each other; and
    first and second connection terminals respectively connected to the first and second external electrodes and each including insulators,
    wherein the first connection terminal includes a first conductive pattern on a first surface facing the first external electrode, a second conductive pattern on a second surface opposing the first surface, a first cut portion in one or more side surfaces that connect the first surface to the second surface, and a third conductive pattern on the first cut portion and electrically connecting the first and second conductive patterns to each other, and
    the second connection terminal includes a fourth conductive pattern on a fourth surface facing the second external electrode, a fifth conductive pattern on a fifth surface opposing the fourth surface, a second cut portion in one or more side surfaces that connect the fourth surface to the fifth surface, and a sixth conductive pattern on the second cut portion and electrically connecting the fourth and fifth conductive patterns to each other.

2. The multilayer electronic component of claim 1, wherein the third conductive pattern is also on one or more other side surfaces of the first connection terminal, and
    the sixth conductive pattern is also on one or more other side surfaces of the second connection terminal.

3. The multilayer electronic component of claim 1, wherein first and second solder accommodating portions are provided by the first and second cut portions on the first and second external electrodes, respectively, on the mounting surface of the capacitor body.

4. The multilayer electronic component of claim 1, wherein the capacitor body includes a plurality of dielectric layers and a plurality of first and second internal electrodes alternately stacked with one or more of the plurality of dielectric layers interposed therebetween and has first and second surfaces opposing each other, third and fourth surfaces connected to the first and second surfaces and opposing each other, and fifth and sixth surfaces connected to the first and second surfaces, connected to the third and fourth surfaces, and opposing each other, and
    respective ends of the first and second internal electrodes are exposed at the third and fourth surfaces, respectively.

5. The multilayer electronic component of claim 4, wherein the first and second external electrodes include, respectively, first and second connection portions respectively on the third and fourth surfaces of the capacitor body and first and second band portions that respectively extend from the first and second connection portions to portions of the first surface of the capacitor body and respectively connected to the first and fourth conductive patterns.

6. The multilayer electronic component of claim 5, wherein the first and second cut portions are open toward the third and fourth surfaces of the capacitor body, respectively.

7. The multilayer electronic component of claim 1, wherein the first and second connection terminals are bump terminals.

8. The multilayer electronic component of claim 1, wherein the first and second connection terminals are insulating substrates.

9. The multilayer electronic component of claim 1, wherein the first and second connection terminals are circuit boards.

10. The multilayer electronic component of claim 1, wherein the insulators included in the first and second connection terminals include epoxy.

11. The multilayer electronic component of claim 1, wherein the first to sixth conductive patterns are metal patterns.

12. A multilayer electronic component comprising:
a capacitor body including a plurality of dielectric layers and a plurality of first and second internal electrodes alternately stacked with one or more of the plurality of dielectric layers interposed therebetween and having first and second surfaces opposing each other, third and fourth surfaces connected to the first and second surfaces and opposing each other, and fifth and sixth surfaces connected to the first and second surfaces, connected to the third and fourth surfaces, and opposing each other, and respective ends of the first and second internal electrodes exposed at the third and fourth surfaces, respectively;
first and second external electrodes including, respectively, first and second connection portions respectively on the third and fourth surfaces of the capacitor body and first and second band portions that respectively extend from the first and second connection portions to portions of the first surface of the capacitor body; and
first and second connection terminals connected to the first and second band portions, respectively,
wherein the first connection terminal includes a first cut portion open toward the third surface of the capacitor body,
wherein the first cut portion and opposing surfaces of the first connection terminal, opposing each other in a first direction in which the first and second surfaces of the capacitor body are connected to each other, have conductivity, and one or more circumferential surfaces of the first connection terminal connecting the opposing surfaces, other than the first cut portion, have insulating properties,
wherein the second connection terminal includes a second cut portion open toward the fourth surface of the capacitor body, and
wherein the second cut portion and opposing surfaces of the second connection terminal, opposing each other in the first direction, have conductivity, and one or more circumferential surfaces of the second connection terminal connecting the opposing surfaces, other than the second cut portion, have insulating properties.

13. The multilayer electronic component of claim 12, wherein one or more of the circumferential surfaces of the first connection terminal have conductivity, and one or more of the circumferential surfaces of the second connection terminal have conductivity.

14. The multilayer electronic component of claim 12, wherein first and second solder accommodating portions are provided by the first and second cut portions on the first and second band portions, respectively, on a mounting surface of the capacitor body.

15. The multilayer electronic component of claim 12, wherein the first and second cut portions have curved surfaces.

16. The multilayer electronic component of claim 12, wherein the first and second cut portions include a plurality of flat surfaces.

17. The multilayer electronic component of claim 12, wherein the first and second connection terminals are bump terminals.

18. The multilayer electronic component of claim 12, wherein the first and second connection terminals are insulating substrates.

19. The multilayer electronic component of claim 12, wherein the first and second connection terminals are circuit boards.

20. The multilayer electronic component of claim 12, wherein insulators included in the first and second connection terminals include epoxy.

21. The multilayer electronic component of claim 12, wherein the surfaces with conductivity include metal patterns.

22. A board having a multilayer electronic component, comprising:
a circuit board having first and second electrode pads on one surface thereof; and
the multilayer electronic component of claim 1 mounted on the circuit board so that the first and second connection terminals are connected to the first and second electrode pads, respectively.

23. A board having a multilayer electronic component, comprising:
a circuit board having first and second electrode pads on one surface thereof; and
the multilayer electronic component of claim 12 mounted on the circuit board so that the first and second connection terminals are connected to the first and second electrode pads, respectively.

24. An electronic device, comprising:
a circuit board;
first and second electrode pads on an upper surface of the circuit board and spaced apart in a length direction;
a capacitor body, including a plurality of first and second internal electrodes alternately stacked, in a thickness direction perpendicular to an upper surface of the circuit board, with dielectric layers interposed therebetween, wherein a lower surface of the capacitor body in the thickness direction is a mounting surface, and wherein respective ends of the first and second internal electrodes are respectively exposed at first and second end surfaces opposing each other in the length direction;
a first external electrode on the first end surface of the capacitor body and including a first band portion extending onto the mounting surface of the capacitor body;
a second external electrode on the second end surface of the capacitor body and including a second band portion extending onto the mounting surface of the capacitor body;

a first connection terminal on and in contact with the first electrode pad, below and in contact with the first band portion, and including a first cut portion on a side surface facing away from the second electrode pad in the length direction;

a second connection terminal on and in contact with the second electrode pad, below and in contact with the second band portion, including a second cut portion on a side surface facing away from the first electrode pad in the length direction, and spaced apart from the first connection terminal;

a first solder electrically connecting the first electrode pad with the first external electrode and within the first cut portion;

a second solder electrically connecting the second electrode pad with the second external electrode and within the second cut portion;

wherein at least a portion of each of the first and second connection terminals includes insulating material, and wherein the first and second cut portions each have electrically conductive surfaces.

25. The electronic device of claim 24, wherein the first and second cut portions each have a rectangular shape.

26. The electronic device of claim 24, wherein the first and second cut portions each have a concave surface.

27. The multilayer electronic component of claim 24, wherein the insulating material is epoxy.

28. A electronic device, comprising:

a circuit board, including first and second electrode pads on an upper surface of the circuit board and spaced apart in a length direction;

a body with a lower surface in a thickness direction perpendicular to the upper surface of the circuit board, with first and second external electrodes on the lower surface of the body and spaced apart from each other in the length direction;

first and second connection terminals comprising insulating material, spaced apart from each other in the length direction, respectively connecting the first and second electrode pads to the first and second external electrodes, respectively including first and second cut portions protruding in a direction perpendicular to the thickness direction, and respectively including first and second electrically conductive patterns on the first and second cut portions, wherein the first and second external electrodes are respectively electrically connected to the first and second electrode pads by solder.

29. The electronic device of claim 28, wherein the first and second cut portions each have a rectangular shape.

30. The electronic device of claim 28, wherein the first and second cut portions each have a concave surface.

31. The electronic device of claim 28, wherein the first and second connection terminals each further respectively include upper and electrically conductive patterns respectively on upper and lower surfaces of the connection terminal and electrically connected by the electrically conductive pattern on the cut portion.

* * * * *